United States Patent

Taki et al.

[11] Patent Number: 6,159,766
[45] Date of Patent: Dec. 12, 2000

[54] DESIGNING METHOD OF LEADFRAME TIP ARRANGEMENT

[75] Inventors: Hirokazu Taki; Akihiro Goto; Hirochika Kawaguchi; Yoshiharu Takahashi; Yasuhito Suzuki, all of Tokyo; Takao Takahashi, Hyogo; Takashi Arita, Hyogo; Satoshi Ookyuu, Hyogo, all of Japan

[73] Assignee: Mitsubishi Denki Kabushiki Kaisha, Tokyo, Japan

[21] Appl. No.: 09/037,963

[22] Filed: Mar. 11, 1998

[30] Foreign Application Priority Data

Aug. 20, 1997 [JP] Japan .................................. 9-223582

[51] Int. Cl.$^7$ .......................... H01L 21/44; H01L 21/48; H01L 21/50
[52] U.S. Cl. ............................. 438/107; 438/111
[58] Field of Search ................... 438/107, 111, 438/FOR 380

[56] References Cited

U.S. PATENT DOCUMENTS 5,245,214  9/1993  Simpson .
5,313,095  5/1994  Tagawa et al. .
5,438,021  8/1995  Tagawa et al. .
5,451,812  9/1995  Gomi .
5,902,119  5/1999  Taki et al. .

FOREIGN PATENT DOCUMENTS 7-49894  2/1995  Japan .
8-227964  3/1996  Japan .

*Primary Examiner*—John F. Niebling
*Assistant Examiner*—Josetta Jones
*Attorney, Agent, or Firm*—Burns, Doane, Swecker & Mathis, LLP

[57] ABSTRACT

To determine leadframe tip positions, a circular arc portion where leadframe tips are to be arranged is determined so as to be opposed to each of the four corners of a die pad by performing a search. Then, straight line portions are set so as to extend from the circular arc portion and to be opposed to the die pad sidelines. The shape of each leadframe tip on the circular arc portion is defined as a region that is sectioned by two concentric circles and two radial rays extending from the center of the concentric circles. The division between the circular arc portion and straight line portions and the setting of the center of the circular arc portion are performed automatically. The leadframe tip width and interval are determined independently of each other.

19 Claims, 5 Drawing Sheets

DESIGNING METHOD OF LEADFRAME TIP ARRANGEMENT

BACKGROUND OF THE INVENTION

This application corresponds to Japanese Patent Application No. Hei 9-223582, filed on Aug. 20, 1997, which is hereby incorporated by reference in its entirety herein.

1. Field of the Invention

The present invention relates to a designing method of leadframe tip arrangement for automatically designing an arrangement of tips of a leadframe used for semiconductor packages.

2. Background Art

In a conventional leadframe tip arrangement method disclosed, for instance, in a Japanese Patent Application, Laid-Open No. 7-49894 entitled "Leadframe Tip Arrangement Designing Method", arrangement positions of leadframe tips are specified first by a cavity line, for instance, and then the leadframe tip width and interval are specified according to the same criterion, such as the same circle diameter. Therefore, it is difficult to provide proper arrangement positions, and it is also necessary to specify the leadframe tip width and interval. Further, since the leadframe tip width and interval are determined according to the same criterion, it is difficult to provide optimum values independently for those parameters.

FIG. 6 is a flowchart that is obtained by modifying a flowchart used in the above conventional leadframe tip arrangement method (Japanese Patent Application Laid-Open No. 7-49894) so that this flowchart can be correlated and compared with an algorithm of the present invention. In FIG. 6, reference symbol S1-2 denotes a design condition input step for inputting arrangement lines such as a cavity line. Symbol S4-2 denotes a leadframe tip width setting step for defining a leadframe width by a circle radius. Symbol S4-3 denotes a leadframe interval calculation step for determining center coordinates of a circle in which the leadframe is to be disposed. Since the leadframe position is determined, the leadframe interval is determined at this step. Symbol S5-2 denotes a step for judging whether the leadframe tip width and the interval fall within the ranges of the desired design conditions. Symbol S7 denotes a judgment step for checking whether the leadframe tips satisfy the design criteria. Finally, symbol S8 denotes a step for presenting design results to the user.

Next, with reference to FIG. 6, the conventional leadframe tip position determining method will be described below in further detail. First, at step S1-2, lines for specifying leadframe tip arrangement positions are input. At step S4-2, a leadframe width is set as a circle radius. At step S4-3, a leadframe interval is determined (center coordinates of the circle that was determined at step S4-2 are determined). At step S5-2, it is judged whether the tip width and interval of the leadframe, that are defined by a tangent line of the circle determined at steps S4-2 and S4-3, fall outside of the desired design conditions.

If the determined leadframe tips are judged to be outside of the ranges of the design conditions (YES) at step S5-2, the process returns to step S4-4, where the center of the circle which determines where to dispose the leadframe is moved to change the leadframe tip interval. If the determined leadframe tips are judged not outside of the ranges of the design conditions (NO), the process goes to step S7, where it is judged whether the determined leadframe tips satisfy the design criteria. If the determined leadframe tips satisfy the design criteria (YES) at step S7, design results are displayed at step S8. If the determined leadframe tips do not satisfy the design criteria (NO), the process returns to step S4-2 to reset the leadframe tip width.

The above conventional method has a disadvantage that a plurality of arrangement lines such as a cavity line need to be input as design conditions. Further, since the leadframe tip width and interval are determined according to the same criterion, pertaining to a circle radius, it is difficult to provide optimum values independently for the lead frame tip width and interval.

As described above, in the conventional leadframe tip arrangement method, it is difficult to determine a cavity line where leadframe tips are located. As a result, designing takes a long time and design results vary to a large extent from one designer to another. Further, the conventional method has the disadvantage that the leadframe tip width and interval cannot be set independently because they are determined according to the same criterion (same radius). This is a significant limitation on the flexibility of this design method.

SUMMARY OF THE INVENTION

The present invention is made to solve the above problems in the conventional art. More specifically, an exemplary object of the present invention is to provide a design method by which a design of the arrangement of leadframe tip positions can be performed automatically and quickly. Another exemplary object of the present invention is to provide a leadframe tip arrangement designing method that can determine the lead frame tip width and interval independently of each other and hence enable more flexibly designing.

According to one aspect of the present invention, in a method of leadframe tip arrangement designing used for designing a leadframe of a semiconductor package, a center of a circular arc is set in a die pad position for each respective corner of the die pad. Then, each circular arc segment is set so as to be opposed to each corner of the die pad based on the center thus set. Straight line segments are set so as to extend from respective ends of the circular arc segment and to be opposed to respective sidelines of the die pad. Further, leadframe tips are arranged along the circular arc segments and the straight line segments.

In the step of setting the center of a circular arc, a search is performed preferably by using the center of a square that is defined by a short sideline of the die pad as a starting point so that a generated leadframe tip arrangement satisfies design criteria.

The setting steps of circular arc segment and the straight line segments are performed preferably so that the generated leadframe tip arrangement satisfies criteria of a leadframe minimum tip width and minimum tip interval.

A shape of a leadframe tip in a circular arc portion is determined preferably by setting, in addition to a first circular arc segment, a second circular arc segment that is concentric with and having a larger radius than the first circular arc segment and a plurality of radial rays extending from the center of the circular arc or a point in its vicinity past the circular arc.

Further, in the step of the leadframe arranging, the leadframe tip width and interval are preferably automatically set independently of each other along the circular arc segments and the straight line segments.

BRIEF DESCRIPTION OF THE DRAWINGS

The foregoing, and other, objects, features and advantages of the present invention will be more readily understood upon reading the following detailed description in conjunction with the drawings in which.

DETAILED DESCRIPTION

An embodiment of the present invention will be hereinafter described with reference to the accompanying drawings. The embodiment is directed to design methods for designing the arrangement and shapes of leadframe tips in a leadframe structure of an LSI package, for example.

Figure 1:
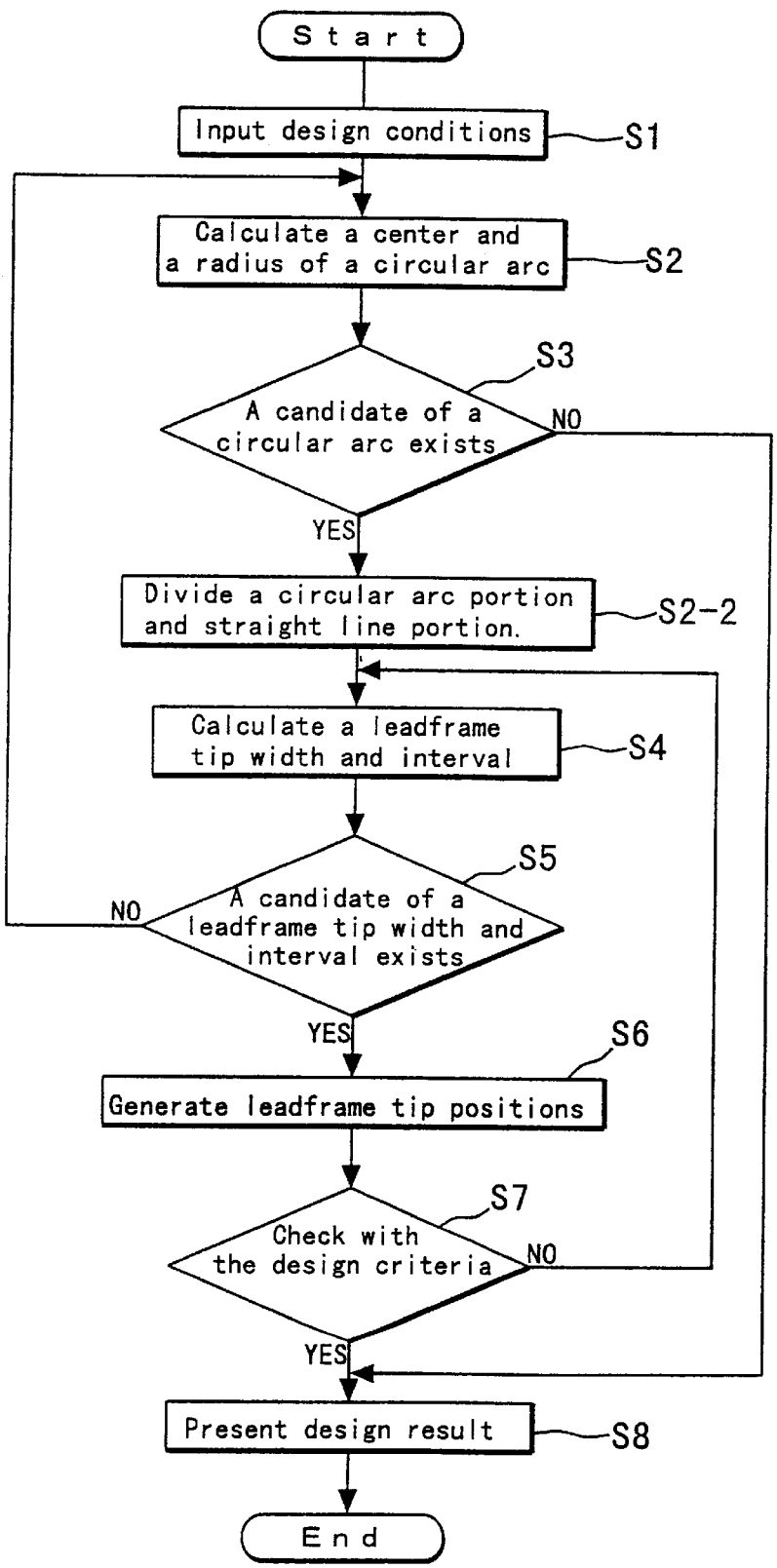
FIG. 1 is a flowchart showing a leadframe tip arrangement designing method according to the present invention.

FIG. 1 is a flowchart showing a leadframe tip arrangement designing method according to the present invention. By way of overview, in FIG. 1, reference symbol S1 denotes a step for inputting design conditions of a target leadframe. Symbol S2 denotes a step for calculating the center and the radius of a circular arc where leadframe tips are to be located. Symbol S3 denotes a step for judging whether there exists a candidate of a circular arc where leadframe tips can be located. Symbol S2-2 denotes a step for performing a calculation for dividing a circular arc portion and straight line portions. Symbol S4 denotes a step for calculating a leadframe tip width and interval. Symbol S5 denotes a step for judging whether there exist candidates of a leadframe tip width and interval. Symbol S6 denotes a step for generating leadframe tip positions. Symbol S7 denotes a judgment step for checking whether the leadframe tips generated at step S6 satisfy the design criteria. Finally symbol S8 denotes a step of presenting design results (or, if there is no design solution, a message to that effect is presented).

Figure 2:
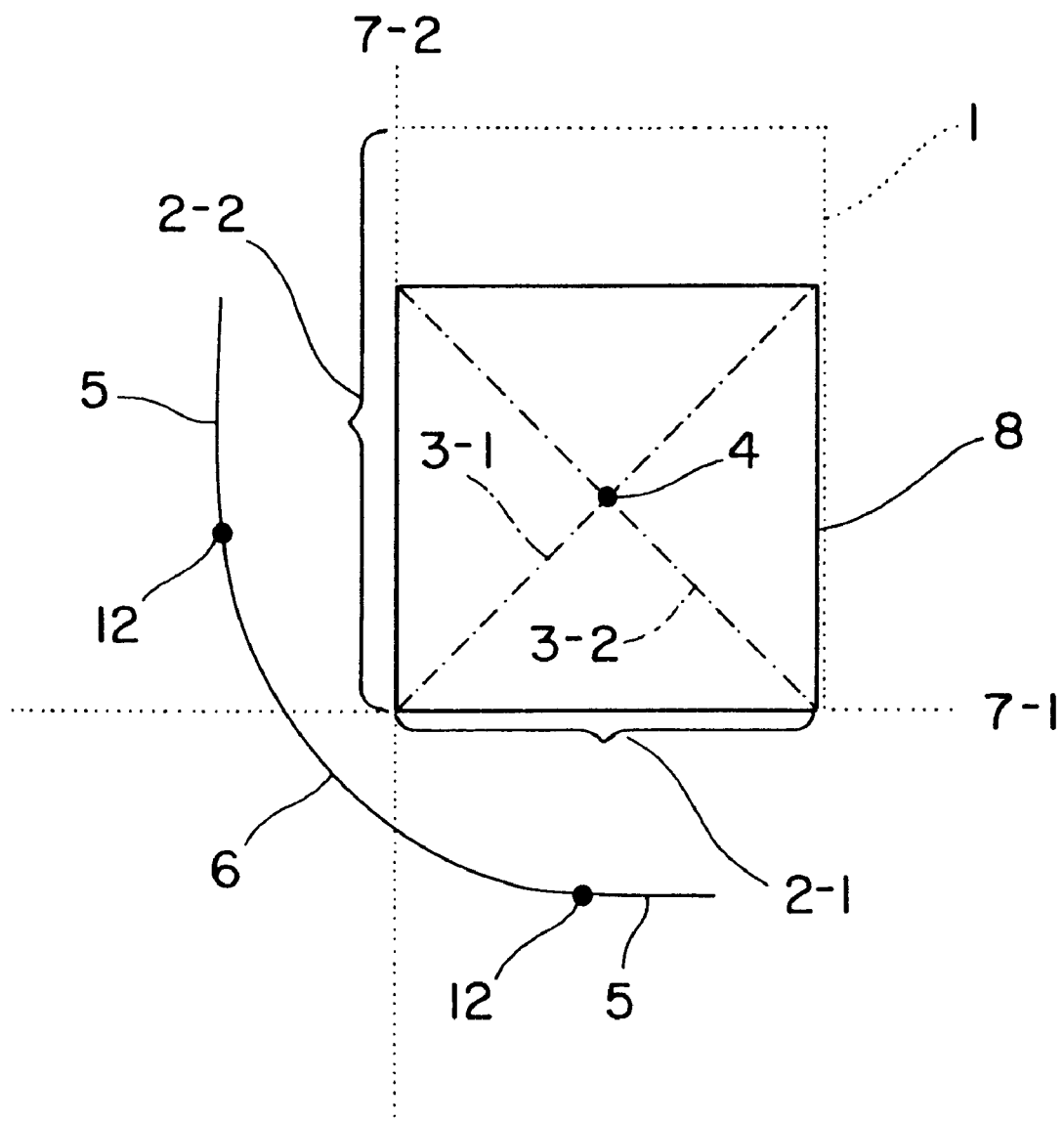
FIG. 2 shows a method for determining a circular arc portion and straight line portions where leadframe tips are to be located according to the present invention.

FIG. 2 shows a method for determining a circular arc portion and straight line portions where leadframe tips are to be located. In FIG. 2, reference numeral 1 denotes an outline of a die pad. Numerals 2-1 and 2-2 denote short and long sidelines, respectively, of the die pad (four sidelines in total). Numeral 8 denotes a square that has the sideline length equal to the length of the die pad short sideline 2-1 and has the die pad short sideline 2-1 as one of its sidelines. Numerals 3-1 and 3-2 denote diagonals of the square 8. Numeral 4 denotes the intersection of the diagonals 3-1 and 3-2. Numeral 5 denotes straight line portions where leadframe tips are to be located. Numeral 6 denotes a circular arc portion where leadframe tips are to be located. Numerals 7-1 and 7-2 denote straight lines including the die pad sidelines 2-1 and 2-2, respectively. Finally, numeral 12 denotes a point of tangency of the circular arc portion 6 and the straight line portions 5. Here, the straight line portion is a tangent of the circular arc portion 6.

Figure 3:
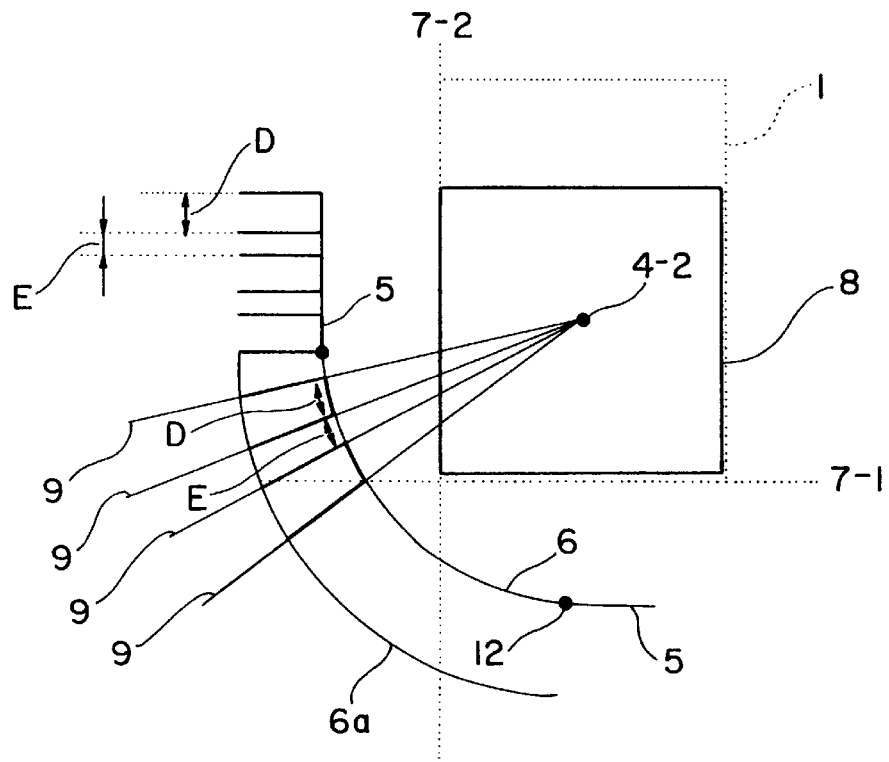
FIG. 3 shows a method for determining leadframe tip shapes according to the present invention.

FIG. 3 shows a method for determining leadframe tip shapes. In FIG. 3, reference numeral 4-2 denotes the center of the circular arc portion 6. Numeral 9 denotes rays that are drawn radially from the center 4-2 of the circular arc portion 6 toward the circular arc portion 6.

Figure 4:
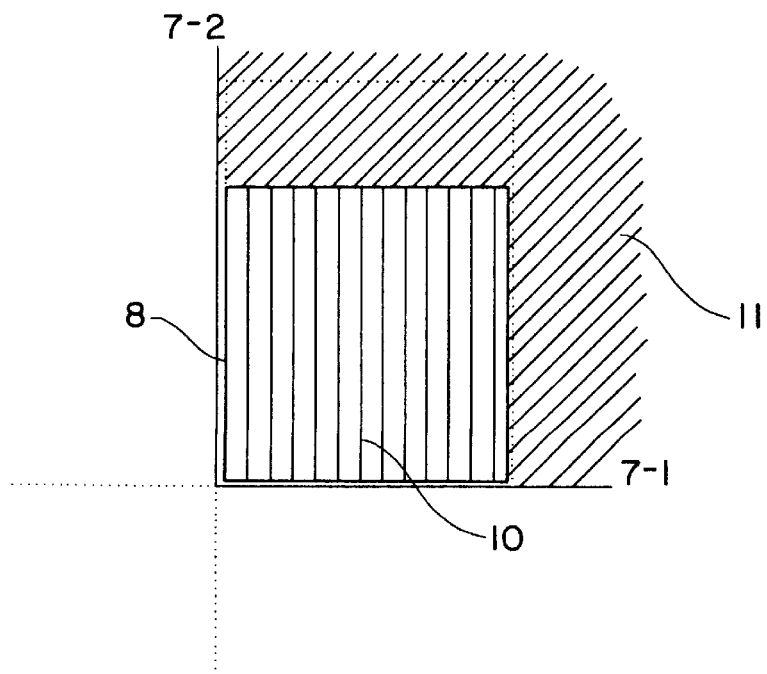
FIG. 4 shows a search area for determining the center of a circular arc portion which defines arrangement positions of leadframe tips according to the present invention.

FIG. 4 shows a search area for determining the center 4-2 of a circular arc portion 6 which defines arrangement positions of leadframe tips. In FIG. 4, a preferential search region 10 is vertically hatched and an auxiliary search region 11 is hatched with slant lines. The auxiliary search region 11 is located, together with the preferential search region 10, in one of four two-dimensional open areas sectioned by the straight lines 7-1 and 7-2.

Figure 5:
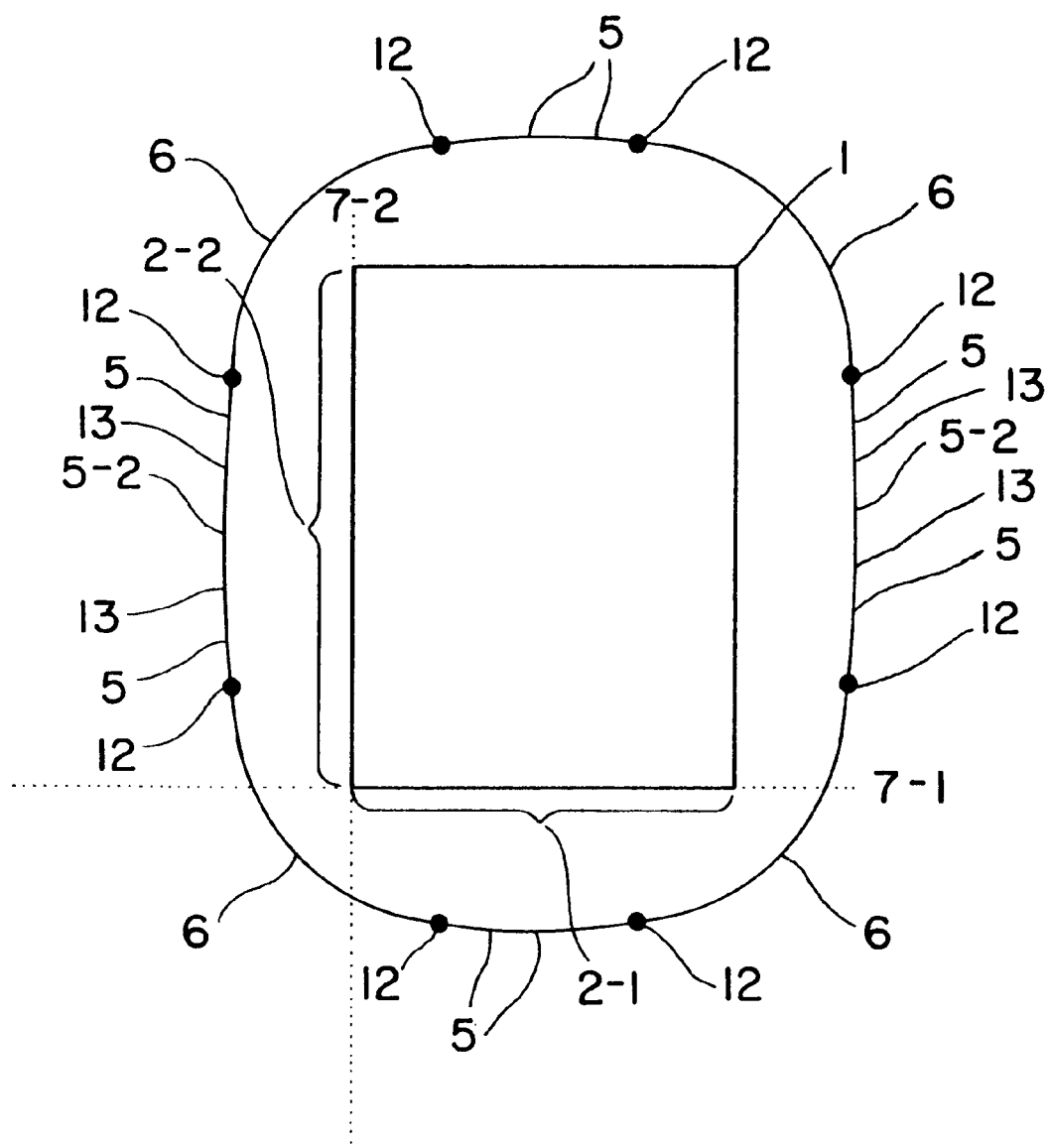
FIG. 5 shows a relationship between leadframe tip arrangement positions and the die pad.
Figure 6:
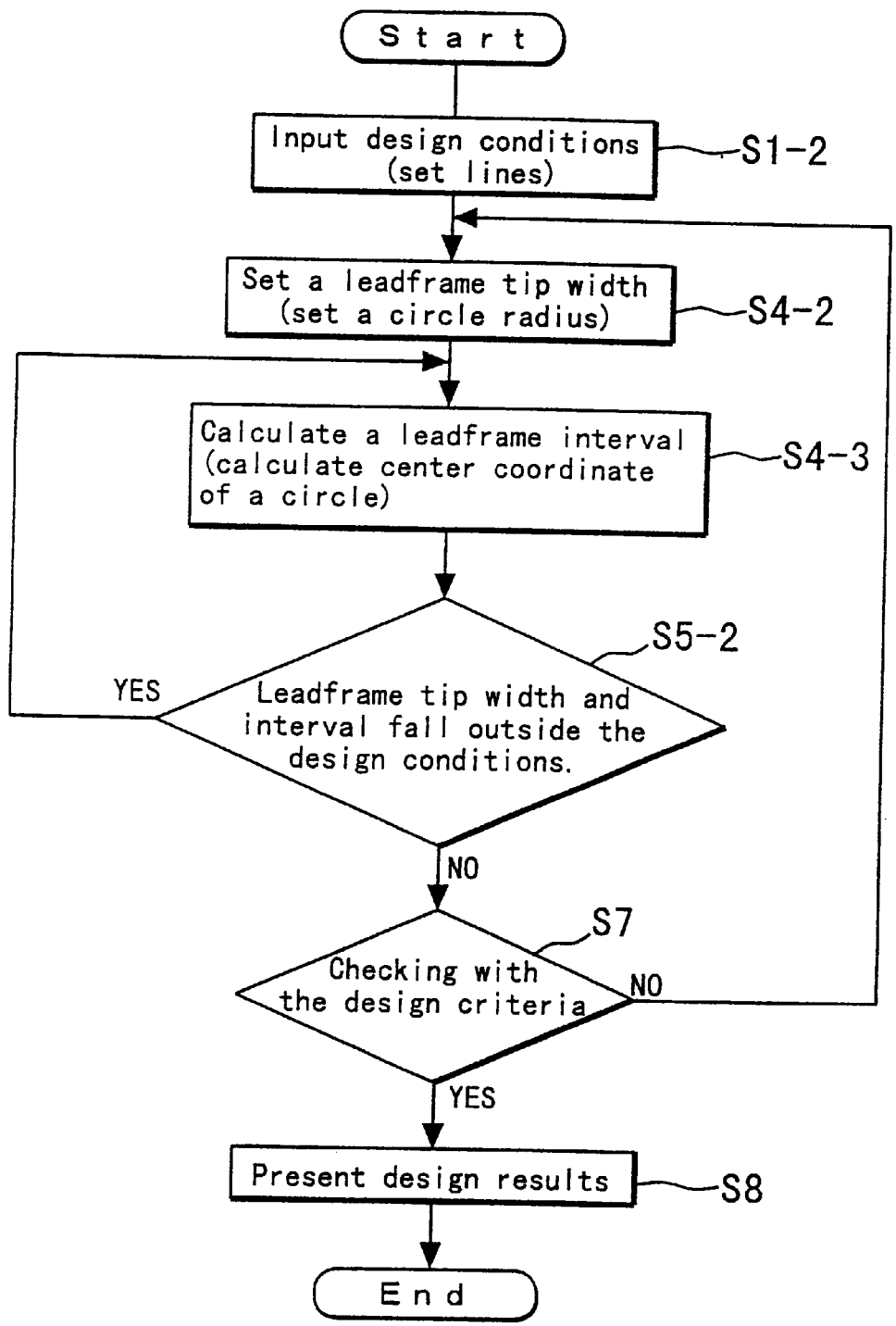
FIG. 6 is a flowchart showing a method of leadframe tip arrangement designing method in a conventional art.

FIG. 5 shows a relationship between leadframe tip arrangement positions and the die pad. Line segments 5-2 are independent of the straight line portions 5 and parallel with the long sideline 2-2 of the die pad 1.

Next, the design method of the present invention will be described with reference to FIG. 1. The leadframe tip arrangement will be described with reference to FIGS. 2–5.

Referring to FIG. 1, at step S1, a die pad size, the number of leadframe tips to be arranged, and a circular arc center search area are input. The circular arc center search area is selected by using the preferential search region 10 and the auxiliary search region 11 shown in FIG. 4. In step S1, the range of the auxiliary search region 11 is input by inputting the lengths of the straight lines 7-1 and 7-2, the range being a rectangular region defined by the straight lines 7-1 and 7-2. The circular arc center search area is set as the thus-input range plus the preferential search region 10.

Then, at step S2, the intersection 4 is used as the initial value of the center 4-2 of the circular arc portion 6. From the second execution onward of step S2, a search operation is performed while the position of the center 4-2 of the circular arc portion 6 is changed sequentially.

In the search operation, first a search is made on the diagonal lines 3-1 and 3-2, then in the preferential search region 10, and finally in the auxiliary search region 11.

When the center 4-2 is determined by the search operation, the radius of the circular arc portion 6 is calculated. With the minimum value that allows arrangement of leadframe tips set as the initial value, the radius is calculated by changing the radius between the initial value and the maximum arrangement-possible value.

If there is no candidate of the circular arc portion 6 (i.e., the center 4-2 and the corresponding radius of the circular arc portion 6), step S2 is not executed.

As described above, in the present invention, the arrangement line of leadframe tips opposed to each of the four corners of the die pad is defined by the circular arc portion 6, and the center 4-2 of the circular arc 6 is determined by searching for a proper point that satisfies the design criteria by using, as the start point, the intersection 4 of the diagonals 3-1 and 3-2 of the square 8 that is defined by the short sideline 2-1 of the die pad.

Then, at step S3, it is judged whether candidates of the center 4-2 and the corresponding radius of the circular arc 6 have been calculated.

If there exist candidates (YES), the process goes to the next step S2-2.

If there are no candidates (NO), the process goes to step S8 to display "no design solution."

At step S2-2, circular arc portions 6, straight line portions 5, and line segments 5-2 are determined so as to surround the outline 1 of the die pad as shown in FIG. 5.

The circular arc portion 6 and the straight line portions 5 are divided so that the angle at the center 4-2 subtended by the circular arc portion 6 becomes 90° or less. The straight line portions 5 are determined so as to be tangent to the circular arc portion 6. The angles of the straight line portions 5 vary with the positions of the points 12 of tangency. Each point 12 of tangency is located so that the end of the straight line portion 5 on the opposite side of the point 12 of tangency is more distant from the outline 1 of the die pad than the point 12 of tangency is.

If part of the straight line portion 5 is more distant from the outline 1 of the die pad than a predetermined value (design reference value), that part is cut away from the straight line portion 5 at a point 13 and a line segment 5-2 is instead disposed parallel with the sideline 2-2 of the die pad outline 1 (see FIG. 5).

In any case, the circular arc portions 6, straight line portions 5, and line segments 5-2 are divided from each other and set so that a generated leadframe tip arrangement satisfies the criteria of the leadframe minimum tip width and minimum tip interval. The length of the line segments 5-2 may be zero depending to the circumstances.

As described above, in the present invention, leadframe tips are located on the circular arc portions 6, the straight line portions 5, and the line segments 5-2 in a divided manner.

Each of the line portions other than the circular arc portions 6 where leadframe tips are arranged is constituted of one or a plurality of line segments that are tangent to the circular arcs 6 or parallel with the die pad outline 1.

Leadframe tips are arranged on the circular arc portions 6 and the straight line portions 5 and 5-2 in a divided manner so that the leadframe tip minimum width and interval (or minimum pitch) satisfy the criteria (limitations from working and manufacture and design criteria).

Step S4 is then performed where a leadframe tip width D and a leadframe tip interval E are calculated. As in the case of step S2, candidates of the leadframe tip width D are generated by changing the leadframe tip width from the minimum tip width to the maximum tip width at a constant increment. Similarly, candidates of the leadframe tip interval E are determined by changing the tip interval from the minimum value to the maximum value at a constant increment.

The shape of one leadframe tip in each circular arc region is defined as a region that is enclosed by two concentric circular arcs, i.e., the circular arc 6 and a circular arc 6a, which is concentric and has a larger radius than the circular arc 6, and two rays 9 drawn radially from the center 4-2 of the circular arcs 6 and 6a (see FIG. 3). The radial rays 9 extending past the circular arc 6 may be drawn from a point in the vicinity of the center 4-2 rather than from the center 4-2 itself.

The shape of leadframe tips on the straight line portions 5 and 5-2 is determined so as to have the same width as on the circular arc 6.

The width D and the interval E of each leadframe tip are automatically determined independently.

Then, if it is judged at the judgment step S5 that candidates of the leadframe width and interval exist, the process goes to the next step S6.

If all combinations of the leadframe tip width and interval have been checked, the judgment result at step S5 becomes NO and the process returns to step S2, where a new center and radius of the leadframe tip circular arc portion 6 are calculated.

If it is judged at step S5 that there exist candidates of the leadframe tip width and interval, the process goes to step S6, where leadframe tips are generated on the circular arc portion 6 (see FIG. 3).

Then, at the judgment step S7, it is judged whether the shapes of the generated leadframe tips satisfy the design criteria that include the limitations from the metal mold working.

If the leadframe tip shapes satisfy the design criteria (YES at step S7), the process goes to step S8, where the determined leadframe tip shapes are presented, i.e., displayed to the designer.

If the design criteria are not satisfied (NO at step S7), the process returns to step S4, where the leadframe tip width and interval are recalculated to obtain other candidates.

The above processing can be performed by a suitably programmed general or special purpose computer or by discrete logic devices. The design results can be displayed on a conventional CRT device, or printed out. Furthermore, the results can be fed to manufacturing equipment which use the results to fabricate the leadframe tip arrangement.

As described above, in the present invention, the leadframe tip arrangement designing method is obtained in which leadframe tips are disposed on a circular arc portion and straight line portions, each of the leadframe tip width and interval can be set constant, and a leadframe structure can be obtained automatically. As a result, metal mold formation and bonding can be performed in a stable manner.

Although the present embodiment employs the circular arc portion 6, the same advantages can be obtained even if this portion is replaced with an elliptical portion. Although, in the present embodiment, the line segment 5-2 is made parallel with the long sideline 2-2 of the die pad outline 1, the line segment 5-2 may be inclined to have an angle that is smaller than the angle formed by the straight line portion 5 and the long sideline 2-2.

The above design method can be used for not only the determination of leadframe tip arrangement positions but also the determination of leadframe wiring shapes (shapes of portions between leadframe tips and legs of an LSI package).

As described above, according to the present invention, since leadframe tip arrangement positions are automatically determined so as to be located on a circular arc portion and straight line portions in a divided manner and the leadframe tip width and interval are automatically determined independently of each other, the designing time can be shortened and variations in design can be reduced.

Since the leadframe tip width and interval can be determined independently of each other, the designing is made more flexible, which provides better design results. As a result, it has become possible to design leadframe structures that are easy to manufacture and enable a stable bonding operation.

Since the search and generation of leadframe tips are performed by sequentially changing the center of a circular arc portion where leadframe tips are to be located by using, as a starting point, the intersection of the diagonals of a square that is defined by the short sideline of a die pad, the designing time can be shortened and variations in design can be reduced.

Since a circular arc portion and straight line portions where leadframe tips are to be located are set so as to satisfy the criteria of the leadframe minimum tip width and minimum tip interval, leadframe structures can be designed that are easy to manufacture and enable a stable bonding operation.

Since, on a circular arc portion where leadframe tips are to be located, the shape of each leadframe tip is determined as a region enclosed by two concentric circles and two radial rays, leadframe structures can be designed that are easy to manufacture and enable a stable bonding operation.

Further, since leadframe tips are arranged along a circular arc portion and straight line portions and the leadframe tip width and interval are automatically set independently of each other, leadframe structures can be designed that are easier to manufacture and enable a more stable bonding operation.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A leadframe tip arrangement designing method used in designing a leadframe of a semiconductor package, comprising the steps of:

setting a center of an arc segment in a die pad position for at least one corner of the die pad;

setting said arc segment so as to be opposed to said one corner of the die pad based on the center thus set;

setting straight line segments which extend from respective ends of the arc segment, wherein said straight line segments are opposed to respective sidelines of the die pad; and arranging leadframe tips along the arc segment and the straight line segments.

2. The method of claim 1, wherein said setting and arranging steps are performed for each corner of said die pad.

3. The method of claim 1, wherein said arc segment is a circular arc segment.

4. The method of claim 1, wherein said arc segment is an elliptical arc segment.

5. The method of claim 1, further including, before said setting steps, a step of inputting design parameters.

6. The method of claim 5, wherein said design parameters include: a die pad size, a number of leadframe tips to be arranged, and an arc center search area.

7. The method of claim 5, wherein said step of inputting includes inputting an arc center search area, and said step of setting said center of said arc segment comprises the step of searching said center search area for a location of said center.

8. The method of claim 7, wherein said center search area is substantially square in shape and has a side length substantially equal to a short sideline of the die pad.

9. The method of claim 7, wherein said step of searching comprises first investigating a center region of said center search area.

10. The method of claim 7, wherein said step of searching comprises successively examining points along at least one diagonal of said center search area.

11. The method of claim 1, further including, after said step of setting a center, a step of calculating a radius of said arc segment.

12. The method of claim 11, wherein said radius is calculated by successively changing the radius between an initial value and a maximum value.

13. The method of claim 1, wherein said step of setting said arc segment comprises setting said arc segment such that an angle at the center subtended by the arc segment is 90° or less.

14. The method of claim 1, wherein said step of setting said straight line segments comprises setting said straight lines segments such that said straight line segments are tangent to said arc segment at ends thereof.

15. The method of claim 1, wherein said steps of setting said arc segment and said straight line segments are performed so that the generated leadframe tip arrangement satisfies criteria of a leadframe minimum tip width and minimum tip interval.

16. The method of claim 1, further comprising the step of determining a shape of a leadframe tip by setting, in addition to setting a first arc segment, a second arc segment that is concentric with and having a larger radius than the first arc segment, and also setting a plurality of radial rays extending from said center or a point in the vicinity of said center.

17. The method of claim 1, wherein the leadframe arranging step automatically arranges said leadframe tips along the arc segment and the straight line segments, wherein a leadframe tip width and a leadframe tip interval are set independently.

18. The method of claim 17, wherein said leadframe tip width is set by changing said width from a minimum value to a maximum value.

19. The method of claim 17, wherein said leadframe tip interval is set by changing said interval from a minimum value to a maximum value.

* * * * *